United States Patent [19]
Kameya

[11] Patent Number: 4,649,356
[45] Date of Patent: Mar. 10, 1987

[54] COMPACTLY CONSTRUCTED ELECTROMAGNETIC DELAY LINE

[75] Inventor: Kazuo Kameya, Tsurugashima, Japan
[73] Assignee: Elmec Corporation, Saitama, Japan
[21] Appl. No.: 815,624
[22] Filed: Jan. 2, 1986
[30] Foreign Application Priority Data Jan. 10, 1985 [JP] Japan .............................. 60-1573[U]
Jan. 11, 1985 [JP] Japan .............................. 60-2534[U]

[51] Int. Cl.$^4$ .............................................. H03H 7/32
[52] U.S. Cl. ...................................... 333/138; 333/140
[58] Field of Search ................. 333/23, 138, 139, 140, 333/23

[56] References Cited
U.S. PATENT DOCUMENTS 2,847,648  8/1958  Wendolkowski et al. .......... 333/140
3,539,949  11/1970  Floser et al. ........................ 333/140
3,602,846  8/1971  Hauser ................................ 333/140

Primary Examiner—Marvin L. Nussbaum
Attorney, Agent, or Firm—Wegner & Bretschneider

[57] ABSTRACT

A low profile high speed electromagnetic delay line capable of long delay times and transmitting signals having rise times less than approximately one nanosecond is described. The electromagnetic delay line is of a single in-line package configuration, but of such a configuration that commercial production is facilitated. A coil assembly has input and output and intermediate terminals extending from the same side of the coil assembly to be connected to flat electrodes on an insulating plate. These connections all occur on the same edge of the insulating plate. At a second opposed edge of the insulating plate are connected terminals leading to external circuits. The various electrodes which receive the coil connections are also connected to the individual capacitors of an elongated flat plate capacitor, and these electrodes are in turn connected to the external connections.

9 Claims, 7 Drawing Figures

COMPACTLY CONSTRUCTED ELECTROMAGNETIC DELAY LINE

BACKGROUND OF THE INVENTION

The present invention relates to an electromagnetic delay line which incorporates a coil and a capacitor, and in particular to a low profile high speed electromagnetic delay line which is suitable for transmission of super high speed signals having rise times less than about one nanosecond.

In the conventional art, an electromagnetic delay line in which coils and capacitors are connected in a ladder network is typically packaged as a dual-in-line package, and is mounted on a circuit board in the same manner as are ICs. Nowadays, a circuit board on which are mounted, for instance, high speed ECL (emitter coupled logic) circuits among other ICs, is typically made as an expensive multi layered circuit board composed of fluoride resin, for the purpose of reducing signal transmission losses. However, as the length of the wiring between the ECLs gets longer, the delay time for transmitting the signal increases, and this increases the timing errors between signals. Further, the cost rises. It is therefore desirable to reduce the wiring length on the circuit board by reducing the size of the circuit board, and to increase the mounting density of the electronic components thereon.

In view of such circumstances, it is desirable for an electromagnetic delay line to have a single-in-line package configuration (hereinafter abbreviated as SIP) which occupies a small mounting area.

However, an electromagnetic delay line which is suitable for super high speed signals and has a low profile while being in SIP form is hard to produce with high productivity, due to its cumbersomeness in manufacture, and special arrangement is required for the configuration of the coils and the capacitors. As a result, as yet no SIP type super high speed electromagnetic delay line has yet been put into commercial production.

SUMMARY OF THE INVENTION

Accordingly, it is the primary object of the present invention to provide a super high speed electromagnetic delay line which is of low profile and is of the SIP type.

It is a further object of the present invention to provide such a super high speed electromagnetic delay line which is easy to manufacture and therefore can be manufactured in an efficient manner.

It is a further object of the present invention to provide such a super high speed electromagnetic delay line which can provide a long delay time.

It is a further object of the present invention to provide such a super high speed electromagnetic delay line which has low loss.

It is a further object of the present invention to provide such a super high speed electromagnetic delay line which has a favorable rise property.

According to the most general aspect of the present invention, these and other objects are accomplished by an electromagnetic delay line comprising: (a) a coil assembly comprising a bobbin and a plurality of turns of an electroconductive element wound on said bobbin, with an input end and an output end of said electroconductive element and also a plurality of intermediate taps defined therealong being projected all in substantially the same substantially transverse direction from the axis of said bobbin; (b) an intermediate plate assembly comprising an insulating plate and on one side of said insulating plate: a first intermediate electrode a first end of which is connected to said input end of said electroconductive element; a second intermediate electrode a first end of which is connected to said output end of said electroconductive element, the other ends of said first and second intermediate electrodes extending towards and terminating substantially at a certain edge of said insulating plate; a plurality of third intermediate electrodes arranged in a mutually spaced apart manner between said first and said second intermediate electrodes with their one ends connected to said intermediate taps of said electroconductive element; and a ground intermediate electrode at said certain edge of said insulating plate between the ends of said first and said second intermediate electrodes thereat; (c) a capacitor electrically connected to said intermediate electrodes; and (d) a means for externally connecting said first and said second intermediate electrodes and said ground intermediate electrode from said certain edge of said insulating plate to the outside.

According to such a structure, there is provided a super high speed electromagnetic delay line which is of low profile and is of the SIP type. And this high speed electromagnetic delay line is easy to manufacture and therefore can be manufactured in an efficient manner. As will be understood from the tests detailed hereinafter, this high speed electromagnetic delay line can provide a long delay time, has low loss, and has a favorable rise property

BRIEF DESCRIPTION OF THE DRAWINGS

The present invention will now be shown and described with reference to the preferred embodiments thereof, and with reference to the illustrative drawings, which however are all of them given purely for the purposes of explanation and exemplification only, and are none of them intended to be limitative of the scope of the present invention in any way. In the drawings, like parts and spaces and so on are denoted by like reference symbols in the various figures thereof; in the description, spatial terms are to be everywhere understood in terms of the relevant figure; and.

DESCRIPTION OF THE PREFERRED EMBODIMENTS

Figure 1:
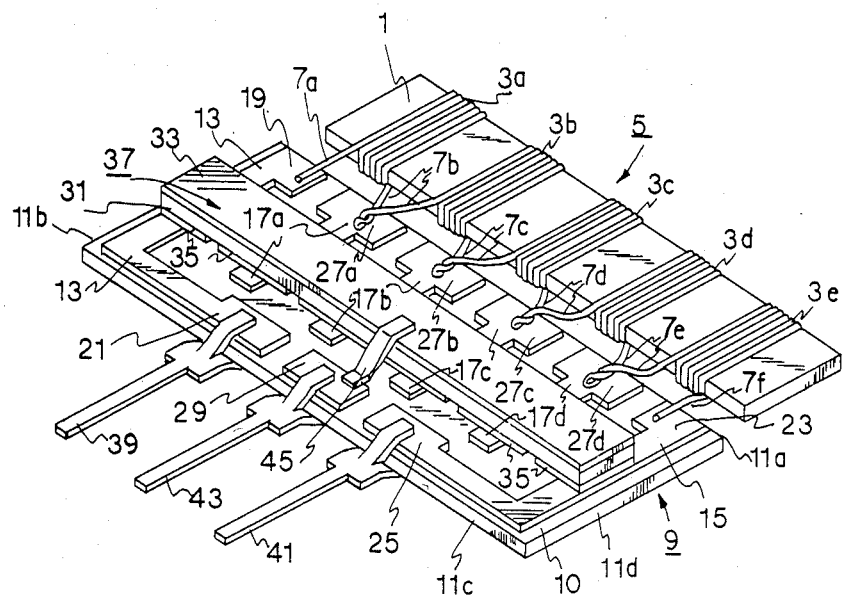
FIG. 1 is a perspective view of the first preferred embodiment of the electromagnetic delay line of the present invention.
Figure 2:
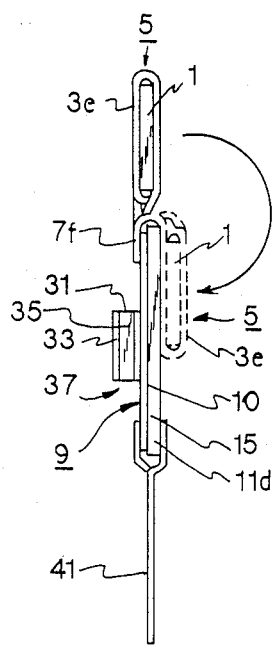
FIG. 2 is a side view of said first preferred embodiment, showing an alternative possible construction for the electromagnetic delay line by phantom lines.

The present invention will now be described with reference to the preferred embodiments thereof, and with reference to the appended drawings. FIG. 1 is a perspective view of the first preferred embodiment of the electromagnetic delay line of the present invention, and FIG. 2 is a side view thereof. In these figures, the reference numeral 1 denotes a flattened and elongated insulating bobbin, which has a plurality, five in the shown embodiment, of coils 3a, 3b, 3c, 3d, and 3e mounted in that order at substantially equal intervals therealong, to constitute a coil structure 5. Each of these coils 3a through 3e is made by winding a number of turns of electroconductive wire which is covered by an insulating coating onto the bobbin 1. The first coil 3a has one lead 7a which serves as an input lead for the coil structure 5 and another lead 7b which is joined to a lead 7b of the second coil 3b; the intermediate coils 3b, 3c, and 3d are connected in series by their joined leads 7c and 7d; and the last coil 3e has one lead 7e which is joined to a lead 7e of the fourth coil 3d and another lead 7f which serves as an output lead for the coil structure 5. Thus, the joined portions of the intermediate leads 7b through 7e serve as intermediate taps for the coil structure 5. The leads 7a and 7f are led out from one side of the bobbin 1 in a transverse direction thereto as substantially straight leads, and the twisted intermediate lead pairs 7b, 7c, 7d and 7e are likewise led out from said one side of said bobbin 1 in said transverse direction thereto as twisted wire pairs.

An intermediate plate assembly 9 supports the bobbin 1 and the coils 3a through 3e. This intermediate plate assembly 9 comprises: a rectangular mounting plate 10; a first intermediate electrode 13 which extends on the upper surface as seen in FIG. 1 of the mounting plate 10 from a connection pad 19 formed a portion of one long side 11a thereof adjacent to its corner with a short side 11b thereof, along said short side 11b, bends around the corner between the short side 11b and the other long side 11c of said mounting plate 10, and further extends along a portion of said other long side 11c, to terminate in a widened end connecting pad 21; a second intermediate electrode 15 which likewise extends on said upper surface as seen in FIG. 1 of said mounting plate 10 from a connection pad 23 formed on a portion of said long side 11a thereof adjacent to its other corner with the other short side 11d thereof, along said short side 11d, bends around the corner between the short side 11d and the other long side 11c of said mounting plate 10, and further extends along a portion of said other long side 11c, to terminate in a widened end connecting pad 25 opposing the other connecting pad 21 with a certain space being left therebetween; and a plurality, four in the shown embodiment, of third intermediate electrodes 17a through 17d which extend in a mutually spaced apart manner from the long side 11a to the long side 11c between the said first and second intermediate electrodes 13 and 15, ending just short of said long side 11c. And the ends of these third intermediate electrodes 17a through 17d on the first long side 11a are terminated in widened end connecting pads 27a through 27d respectively. And between the connecting pads 21 and 25 of the first and second intermediate electrodes 13 and 15 on the long side 11c there is provided a ground side intermediate electrode 29.

The input lead 7a for the coil structure 5 is connected by soldering or the like means (not particularly shown) to the connecting pad 19 of the first intermediate electrode 13 on the long side 11a; the output lead 7f of said coil structure is likewise connected to the connecting pad 23 of the second intermediate electrode 15 on said side 11a; and the four joined portions of the intermediate leads 7b through 7e are likewise connected to the corresponding ones of the connecting pads 27a through 27d of the third intermediate electrodes 17a through 17d.

A composite capacitor denoted as 37 is constituted as follows. Over the first and the second intermediate electrodes 13 and 15 and over the set of third intermediate electrodes 17a through 17d lying in between them there is laid a flattened and elongated dielectric plate 31, and over the whole of the upper surface as seen in FIG. 1 of this dielectric plate 31 there is fitted a ground electrode 33. As for the under surface from the point of view of FIG. 1 of the dielectric plate 31, the composite capacitor 37 is shown in partial upside down perspective view in FIG. 3, and it will be understood therefrom that a plurality (six in the shown embodiment) of capacitive electrodes 35 are secured on said lower surface. As seen in FIG. 1, one of these capacitive electrodes 35 is in contact with each of the first and the second intermediate electrodes 13 and 15 and the third intermediate electrodes 17a through 17d; and each is connected by soldering or the like means (again not particularly shown) to its said intermediate electrode.

An input terminal 39 is connected to the connecting pad 21 of the first intermediate electrode 13, an output terminal 41 is likewise connected to the connecting pad 25 of the second intermediate electrode 15; and a ground electrode 43 is connected to the ground side intermediate electrode 29. And this ground side intermediate electrode 29 is connected by a connection piece 45 to the ground electrode 33 of the composite capacitor 37. Thereby, a lumped constant type electromagnetic delay line having a plurality of sections is constituted by the coils 3a through 3e and the composite capacitor 37. Although it is not particularly so shown in any of the figures, the whole construction is desirably housed in a casing or molded package, in order to prepare it for commercial release.

The electromagnetic delay line thus formed can be made in a SIP configuration, since the coils 3a through 3e and the input, output, and ground electrodes 39, 41, and 43 are mounted on the intermediate plate assembly 9 so as to extend therefrom. The final product may have a very low profile, i.e. may be very thin, since the coils 3a through 3e, the intermediate plate assembly 9, and the composite capacitor 37 may be made very small in thickness. Further, if the leads 7a through 7f of the conjoined coils 3a through 3e are laid against the long side 11a of the intermediate plate assembly 9, then said leads 7a through 7f can be connected to the connecting pads 19, 27a through 27d, and 23 of the first and second intermediate electrodes 13 and 15 and the third intermediate electrodes 17a through 17d, all at once, and this makes for convenience of assembly. Likewise, if the input and output terminals 39 and 41 and the ground electrode 43 are laid against the other long side 11c of the intermediate plate assembly 9, then said terminals 39, 41 and 43 can be connected to the connecting pads 21 and 25 of the first and second intermediate electrodes 13 and 15 and to the ground side intermediate electrode 29 all at once, which again makes for convenience of assembly. Therefore, in either case, production is easy and the efficiency can be increased, thereby minimizing cost.

Further, mass production is easy if the mounting plate 10 of the intermediate plate assembly 9 is made of copper-plated fluoride resin laminate board reinforced by glass fiber, and the circuits thereon are formed by photo etching, and the coil assembly incorporating the bobbin 1 and the coils 3a through 3e may also be made by first forming a large number of such coils on an elongated bobbin which is much longer than the bobbin 1 shown in FIG. 1, and by subsequently cutting said bobbin apart at appropriate places between the coils thereon to form a plurality of separate coil assemblies. Another production expedient is to form the input and output terminals 39 and 41 and the ground electrode 43 together as portions of a lead frame, and to cut away the redundant portions of said lead frame after said terminals have been mounted to the intermediate plate assembly 9. Also, the composite capacitor 37 may be produced in large number by forming capacitive electrodes as stripes on one of the major surfaces of a wide dielectric plate, by printing and later baking a ground electrode over the whole superficies of the other major surface of said dielectric plate, and by then cutting this assembly into pieces of appropriate lengths and widths.

To considering a manufacturing example, the present inventive entity cut a fluoride resin plate of about 0.13 mm thickness reinforced by glass fiber and plated on both sides with a copper layer of about 0.035 mm thickness to bring its dimensions to about 11.3 mm by 8.5 mm, and then formed the first and second intermediate electrodes 13 and 15, and eight third intermediate electrodes 17a through 17d (using the nomenclature of the shown embodiment although the number of intermediate electrodes 17a through 17d is different) thereon by photo etching, in order to prepare the intermediate plate 9. Further, said inventive entity formed the bobbin 1 by cutting a fluoride resin plate of about 0.7 mm thickness reinforced by glass fiber to have a width of about 7.3 mm, and wound polyurethane coated copper wire of about 0.2 mm diameter around this bobbin 1 to form thereon nine coils 3a through 3e (likewise using the FIG. 1 nomenclature) each of three turns, at a spacing of about 1.2 mm therebetween. These coils 3a through 3e were then connected up, in a fashion analogous to that shown in the figure, to the intermediate electrodes 13, 15, and 17a through 17d. And a composite capacitor 37 having eight capacitive elements of about 5.8 pF for each capacitive electrode 35 was formed as detailed above, and the eight capacitive electrodes 35 were individually connected to the eight intermediate electrodes 17a through 17d. Thereby, an electromagnetic delay line as shown in FIG. 1, but with nine coils, was formed. And this line had the following super high speed properties: characteristic impedance about 98 ohms; delay time about 5 nanoseconds; and rise time about 0.98 nanoseconds.

Figure 3:
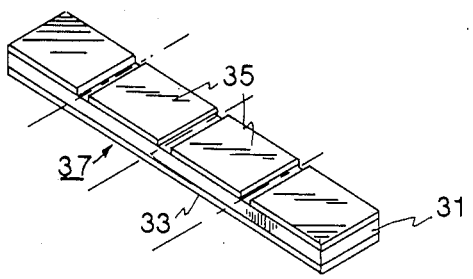
FIG. 3 shows a composite capacitor incorporated in said first preferred embodiment in partial upside down perspective view.

The capacitor system for the present invention need not be a composite capacitor, but, as a modification of the shown embodiment, said capacitor system may also be constituted by a set of individual capacitors, which may be formed by cutting apart the composite capacitor 37 of FIG. 3 along the double dotted chain lines, and by connecting these individual capacitors to the first, the second, and the third intermediate electrodes 13, 15, and 17a through 17d individually. As an alternative modification, according to the electromagnetic delay line of the present invention, as suggested by the phantom lines in FIG. 2, the coil structure 5 comprising the bobbin 1 and the coils 3a through 3e may be folded over the rear surface of the mounting plate 10 of the intermediate plate assembly 9 by bending the leads 7a through 7f of the coils 3a through 3e. In this way, the height of the electromagnetic delay line of the present invention can be drastically reduced, without much increasing the thickness thereof, if the coils 3a through 3e are sufficiently flattened.

Figure 4:
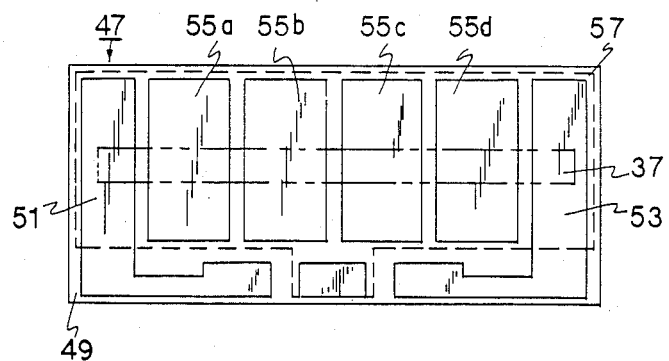
FIG. 4 is a plan view of an intermediate plate assembly utilized in a variation of said first preferred embodiment of the present invention.

The above described embodiments related to structures in which separate capacitors were individually connected to the first, the second, and the third intermediate electrodes 13, 15, and 17a through 17d individually, but the present invention is not to be considered as limited to this, and for example as shown in FIG. 4 these separate capacitors may be omitted by using an intermediate plate assembly 47. Specifically, by forming first, second, and a plurality of third intermediate electrodes 51, 53, and 55a through 55d respectively, corresponding respectively to but substantially wider than the first, the second, and the third intermediate electrodes 13, 15, and 17a through 17d of the FIG. 1 construction, on the one surface of an insulating plate 49 made for instance of ceramic material having a high dielectric constant, and by forming a ground electrode 57 on the other side of said insulating plate 49, capacitors are formed between the ground electrode 57 and the first, second, and third intermediate electrodes 51, 53, and 55a through 55d. According to this structure, also, the connections between the coils 3a through 3e and the intermediate electrodes are substantially the same as those of the FIG. 1 embodiment, mutatis mutandis.

According to such an electromagnetic delay line incorporating an intermediate plate assembly 47, since no separate composite capacitor such as the composite capacitor 37 of the FIG. 1 embodiment is required, the number of components is further reduced, and further reduction in cost is possible. Furthermore, in the case of a super high speed electromagnetic delay line, since the capacitive values are small, such a structure is quite sufficient in order to obtain the desired properties. To obtain a desired capacitive value, it is possible to use the previously described composite capacitor 37, as indicated by the double dotted chain line in FIG. 4.

Figure 5:
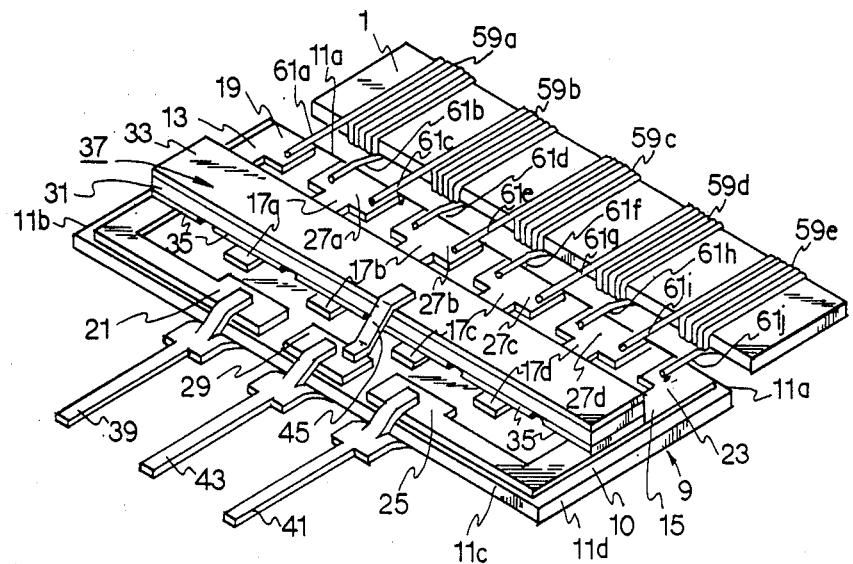
FIG. 5 is a perspective view, similar to FIG. 1 for the first preferred embodiment, showing the second preferred embodiment of the electromagnetic delay line of the present invention.

Now, the second preferred embodiment of the electromagnetic delay line of the present invention, shown in perspective view in FIG. 5 in a manner similar to FIG. 1 relating to the first preferred embodiment, will be described. This electromagnetic delay line incorporates, as before, five coils 59a through 59e wound around a bobbin 1, having leads designated respectively as 61a and 61b, 61c and 61d, 61e and 61f, 61g and 61h, and 61i and 61j. In contradistinction to what was done in the first preferred embodiment, the electrical connections between the neighboring ones of the coils 59a through 59e are not provided by winding together the ends of the wires of said coils; instead, these connections are provided by soldering the adjacent leads of said neighboring coils directly to the corresponding ones of the connecting pads 27a through 27d of the third intermediate electrodes 17a through 17d; in other words, the lead 61b of the coil 59a and the lead 61c of the adjacent coil 59b are individually soldered to the connecting pad 27a and are thereby connected to one another, the lead 61d of said coil 59b and the lead 61e of the adjacent coil 59c are individually soldered to the connecting pad 27b and are thereby connected to one another, the lead 61f of said coil 59c and the lead 61g of the adjacent coil 59d are individually soldered to the connecting pad 27c and are thereby connected to one another, and also the lead 61h of said coil 59d and the lead 61i of the adjacent coil 59e are individually soldered to the connecting pad 27d and are thereby connected to one another. And, as was done before, the input lead 61a of the coil 59a is soldered to the connecting pad 19 of the first intermediate electrode 13, and similarly the output lead 61j of the coil 59e is soldered to the connecting pad 23 of the second intermediate electrode 15. As an alternative, the intermediate electrodes could be formed in the manner shown in FIG. 4.

Thus, according to the present invention, it is possible either to connect the intermediate taps between the neighboring ones of the coils by twisting together the leads of said coils and then by connecting said twisted lead pairs to the intermediate electrodes as in the first preferred embodiment shown above, or to connect said intermediate taps between the neighboring ones of the coils by directly connecting the leads of said coils to the intermediate electrodes as in the second preferred embodiment. In short, it suffices if coils are used which are made by winding an electrical conductor in a coaxial manner in a plurality of turns, and which are connected in series with their combination being provided with input, output and intermediate taps all extending substantially in the same direction transversely to its axis.

Now, the third preferred embodiment of the electromagnetic delay line of the present invention, shown in plan view in FIG. 6 and in side view in FIG. 7, will be described. This electromagnetic delay line incorporates, as in the FIG. 5 embodiment, five coils 59a through 59e wound around a bobbin 1, which are coaxial, having leads designated respectively as 61a and 61b, 61c and 61d, 61e and 61f, 61g and 61h, and 61i and 61j. And these leads project all substantially in the same direction transversely to the axis of the bobbin 1, and are supported by an intermediate plate assembly 63. In detail, in this intermediate plate assembly 63, one surface of an insulating plate 65 which serves as a dielectric plate has first and second intermediate electrodes 67 and 69 formed substantially as before as electroconductive strips with connecting pad portions 81 and 85, and 83 and 87, respectively; and said insulating plate 65 further has four third intermediate electrodes 71a, 71b, 71c, and 71d, each of which is formed as an electroconductive strip with two parallel leaves joined by a base portion, respectively designated as 77a, 77b, 77c, and 77d. The leaves of all these third intermediate electrodes 71a, 71b, 71c, and 71d are substantially parallel and spaced apart, and their ends substantially lie on the long side 66a of the insulating plate 65 confronting the coil assembly. The lead 61b of the coil 59a and the lead 61c of the adjacent coil 59b are soldered to the two leaves of the third intermediate electrode 71a and are thus electrically connected together via the intermediate electrode 71a thereof; the lead 61d of said coil 59b and the lead 61e of the adjacent coil 59c are soldered to the two leaves of the third intermediate electrode 71b and are thus electrically connected together via the third intermediate electrode 71b thereof; the lead 61f of said coil 59c and the lead 61g of the adjacent coil 59d are soldered to the two leaves of the third intermediate electrode 71c and are thus electrically connected together via the third intermediate electrode 71b thereof; and also the lead 61h of said coil 59d and the lead 61i of the adjacent coil 59e are soldered to the two leaves of the third intermediate electrode 71d and are thus electrically connected together via the third intermediate electrode 71b thereof. And, as was done before, the input lead 61a of the coil 59a is soldered to the connecting pad 81 of the first intermediate electrode 67, and similarly the output lead 61j of the coil 59e is soldered to the connecting pad 83 of the second intermediate electrode 69.

Figure 6:
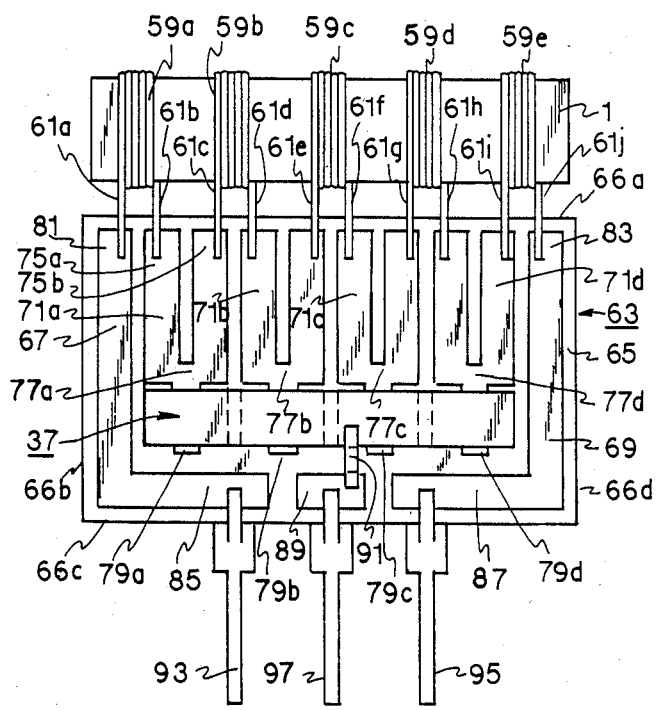
FIG. 6 is a plan view showing the third preferred embodiment of the electromagnetic delay line of the present invention.
Figure 7:
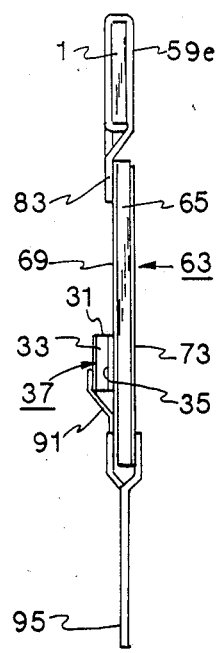
FIG. 7 is a side view of said third preferred embodiment.

The other side of the insulating plate 65 is covered over by a ground electrode 73, hidden in FIG. 6 but visible from the side in FIG. 7, and this ground electrode 73 opposes all of the first and second intermediate electrodes 67 and 69 and the third intermediate electrodes 71a through 71d, through the dielectric insulating plate 65. A composite capacitor 37 is fixedly connected to capacitor connecting pads 79a through 79d formed at the ends of the base portions 77a through 77d of the third intermediate electrodes 71a through 71d, so that the terminal 35 thereof is electrically connected to said capacitor connecting pads 79a through 79d. The ground electrode 33 of said composite capacitor 37 is connected to a ground electrode 97 protruding from the long side 66c of the intermediate plate assembly 63, via a connecting piece 91 and a connection pad 89 as in the first preferred embodiment disclosed. And also an input terminal 93 and an output terminal 95 are provided as respectively connected to the connection pads 85 and 87 of the first and second intermediate electrodes 67 and 69 respectively. The ground electrode 97 is also connected to the ground electrode 73 on the back of the insulating plate 65.

With such an electromagnetic delay line, since the composite capacitor 37 is connected to the third intermediate electrodes 71a through 71d the individual capacitances formed in the composite capacitor 37 are added to the capacitances formed in the third intermediate electrodes 71a through 71d by themselves. Thus, the overall capacitance can be increased, even when fluoride resin having a relatively low dielectric constant is used as the dielectric material. Therefore, even when the first through the third intermediate electrodes 67, 69, and 71a through 71d are formed by copper plating over a laminate board made of fluoride resin, a desired delay time may be obtained without increasing the line length, and the advantages of small loss and compactness can be maintained.

Further, since the third intermediate electrodes 71a through 71d and the coils 59a through 59e are arranged in an alternating manner, and positive mutual inductive couplings are formed between the coils 59a through 59e, the negative couplings formed between the third intermediate electrodes 71a through 71d will be adequately controlled by these positive couplings formed between the coils 59a through 59e, and, due to the compensation of the inductance by the coils 59a through 59e, preshoot and overshoot may be adjusted to the same level, thereby providing wave forms which rise very quickly and are relatively free from distortion.

As in the first and second preferred embodiments described earlier, this third preferred embodiment has the merits of a compact SIP configuration and of good manufacturability because of easy assemblability.

To considering a manufacturing example for this third preferred embodiment, the present inventive entity cut a fluoride resin plate of about 0.13 mm thickness reinforced by glass fiber and copper-plated to about 0.035 mm thickness to bring its dimensions to about 11.3 mm by 8.5 mm, as before, and then formed the first and second intermediate electrodes 67 and 69, and again eight third intermediate electrodes 71a through 71d (using the nomenclature of the shown third preferred embodiment although the number of intermediate electrodes 17a through 17d is different) thereon by photo etching, to provide a configuration as shown in FIG. 6, in order to prepare the intermediate plate 63. Further, said inventive entity formed the bobbin 1 by cutting a fluoride resin plate of about 0.7 mm thickness reinforced by glass fiber to have a width of about 7.3 mm, as before, and wound polyurethane coated copper wire of about 0.2 mm diameter around this bobbin 1 to form thereon nine coils 59a through 59e (likewise using the FIG. 6 nomenclature) each of three turns, at a spacing of about 1.2 mm therebetween. These coils 59a through 59e were then connected up, in a fashion analogous to that shown in the figure, to the intermediate electrodes 67 and 69 and the eight third intermediate electrodes 71a through 71d. And a composite capacitor 37 having eight capacitive elements of about 5.1 pF for each capacitive electrode 35 was formed, and the eight capacitive electrodes 35 were individually connected to the eight third intermediate electrodes 71a through 71d, only. Thereby, an electromagnetic delay line as shown in FIG. 6, but with nine coils, was formed. And this line had the following super high speed properties: characteristic impedance about 102 ohms; delay time about 5.1 nanoseconds; and rise time about 0.95 nanoseconds.

In the above described third preferred embodiment, the third intermediate electrodes 71a through 71d were made of strips effectively bent into the shape of a letter "C", but this invention is not to be considered as limited to this construction. Further, in this third preferred embodiment, as in the first and second preferred embodiments, it is possible to use chip capacitors as the capacitors to be connected to the eight third intermediate electrodes 71a through 71d. In short, it suffices if auxiliary capacitors are connected for the purposes of supplementing the capacitance, and it is more desirable to use auxiliary capacitors which use ceramic and other dielectric material which are different from the material of the insulating plate 65 on which the third intermediate electrodes 71a through 71d are formed, in order to obtain sufficient capacitive values without increasing the size of the electromagnetic delay line.

Thus, it is seen that according to the present invention there is provided a super high speed electromagnetic delay line which is of low profile and is of the SIP type. And this high speed electromagnetic delay line is easy to manufacture and therefore can be manufactured in an efficient manner. And this high speed electromagnetic delay line can provide a long delay time, has low loss, and has a favorable rise property.

Although the present invention has been shown and described with reference to the preferred embodiments thereof, and in terms of the illustrative drawings, it should not be considered as being limited thereby, since many alterations could be made in the perhaps purely fortuitous details thereof, but as being defined solely by the scope of the appended claims, which follow.

What is claimed is:

1. An electromagnetic delay line comprising:
    a. a coil assembly comprising a bobbin and a plurality of turns of an electroconductive element wound on said bobbin, with an input end and an output end of said electroconductive element and also a plurality of intermediate taps defined therealong, said ends and said taps being projected all in substantially the same substantially transverse direction from the axis of said bobbin;
    b. an intermediate plate assembly comprising an insulating plate and on one side of said insulating plate: a first intermediate electrode, a first end of which is connected to said input end of said insulating electroconductive element adjacent a first edge of said insulating plate; a second intermediate electrode, a first end of which is connected to said output end of said electroconductive element adjacent said first edge of said insulating plate, the other ends of said first and second intermediate electrodes extending towards and terminating substantially at a second edge of said insulating plate which is opposite said first edge; a plurality of third intermediate electrodes arranged in a mutually spaced apart manner between said first and said second intermediate electrodes with their one ends connected to said intermediate taps of said electroconductive element adjacent said first edge of said insulating plate; and a ground intermediate electrode at said second edge of said insulating plate between the ends of said first and said second intermediate electrodes thereat;
    c. a capacitor electrically connected to said intermediate electrodes; and
    d. a means for electrically connecting said first and second intermediate electrodes and said ground intermediate electrode from said second edge of said insulating plate to an external electrical circuit.

2. An electromagnetic delay line according to claim 1, wherein said capacitor comprises an elongated dielectric plate, a ground electrode formed on one surface of said dielectric plate, and a plurality of capacitive electrodes arranged linearly along the other surface of said dielectric plate so as to oppose said ground electrode, said capacitive electrodes being connected at least to said third intermediate electrodes.

3. An electromagnetic delay line according to claim 2, wherein said dielectric plate is substantially constituted by a portion of said insulating plate, and said ground electrode is provided on the opposite surface of said insulating plate from said first, second, and third intermediate electrodes, so that said ground electrode opposes said first, second, and third intermediate electrodes with said insulating plate therebetween to constitute said capacitor.

4. An electromagnetic delay line comprising:
    a. a coil assembly comprising an elongated bobbin and a plurality of coils arranged in a row each formed by winding a plurality of turns of an electroconductive element on said bobbin, an input end of the electroconductive element of an extreme one of said coils constituting an input end of said coil assembly and an output end of the electroconductive element of the other extreme one of said coils constituting an output end of said coil assembly, and the other ends of the electroconductive elements of said coils constituting intermediate leads;
    b. an intermediate plate assembly comprising an insulating plate and on one side of said insulating plate: a first intermediate electrode, a first end of which is connected to said input end of said coil assembly adjacent a first edge of said insulating plate; a second intermediate electrode, a first end of which is connected to said output end of said coil assembly adjacent said first edge of said insulating plate, the other ends of said first and second intermediate electrodes extending towards and terminating substantially at a second edge of said insulating plate opposite said first edge; a plurality of third intermediate electrodes, one less than the number of coils in said coil assembly, arranged in a mutually spaced apart manner between said first and said second intermediate electrodes with to a first end of each of said third intermediate electrodes being connected, respectively to each of the two said interemdiate leads of each of two neighboring ones of said coils, so that said coils are all electrically connected in series, said connections being made adjacent the first edge of said insulating plate; and a ground intermediate electrode at said second edge of said insulating plate between the ends of said first and said second intermediate electrodes thereat;

c. a capacitor electrically connected to said intermediate electtodes; and d. a means for electrically connecting said first and second intermediate electrodes and said ground intermediate electrode from said second edge of said insulating plate an external electrical circuit.

5. An electromagnetic delay line according to claim 4, wherein said capacitor comprises an elongated dielectric plate, a ground electrode formed on one surface of said dielectric plate, and a plurality of capacitive electrodes arranged linearly along the other surface of said dielectric plate so as to oppose said ground electrode, said capacitive electrodes being connected at least to said third intermediate electrodes.

6. An electromagnetic delay line according to claim 5, wherein said dielectric plate is substantially constituted by a portion of said insulating plate, and said ground electrode is provided on the opposite surface of said insulating plate from said first, second, and third intermediate electrodes, so that said ground electrode opposes said first, second, and third intermediate electrodes with said insulating plate therebetween to constitute said capacitor.

7. An electromagnetic delay line comprising:

a. a coil assembly comprising an elongated bobbin and a plurality of coils arranged in a row each formed by winding a plurality of turns of an electroconductive element on said bobbin, an input end of the electroconductive element of an extreme one of said coils constituting an input end of said coil assembly and an output end of the electroconductive element of the other extreme one of said coils constituting an output end of said coil assembly, and the other ends of the electroconductive elements of said coils constituting intermediate leads;

b. an intermediate plate assembly comprising:
 (b1) an insulating plate;
 (b2) on one side of said insulating plate: a first intermediate electrode, a first end of which is connected to said input end of said coil assembly adjacent the first edge of said insulating plate; a second intermediate electrode a first end of which is connected to said output end of said coil assembly adjacent said first edge of said insulating plate, the other ends of said first and second intermediate electrodes extending towards and terminating substantially at a second edge of said insulating plate opposite said first edge of said insulating plate; a plurality of third intermediate electrodes, one less than the number of coils in said coil assembly, arranged in a mutually spaced apart manner between said first and said second intermediate electrodes with an end of each of said third intermediate electrodes being connected adjacent said first edge of said insulating plate to two said intermediate leads of each of two neighboring ones of said coils, so that said coils are all electrically connected in series; and a ground intermediate electrode at said second edge of said insulating plate between the ends of said first and said second intermediate electrodes thereat; and
 (b3) on the other side of said insulating plate: a ground electrode which opposes said first, second, and third intermediate electrodes with said insulating plate therebetween;

(c) a capacitor electrically connected to said intermediate electrodes; and (d) a means for electrically connecting said first and said second intermediate electrodes and said ground intermediate electrode from said second edge of said insulating plate to an external electrical circuit.

8. An electromagnetic delay line according to claim 7, wherein said third intermediate electrodes are formed in C shapes with their free ends terminating at said opposite edge of said insulating plate, with their free ends being connected to said intermediate leads of said coils.

9. An electromagnetic delay line according to claim 8, wherein said capacitor comprises an elongated dielectric plate, said ground electrode formed on said other surface of said dielectric plate, and a plurality of capacitive electrodes arranged linearly along the other surface of said dielectric plate so as to oppose said ground electrode, said capacitive electrodes being connected to said third intermediate electrodes at their bent portions.

* * * * *